(12) United States Patent
Gosain et al.

(10) Patent No.: US 6,645,837 B2
(45) Date of Patent: Nov. 11, 2003

(54) METHOD OF MANUFACTURING SEMICONDUCTOR DEVICE

(75) Inventors: Dharam Pal Gosain, Kanagawa (JP); Kazumasa Nomoto, Kanagawa (JP); Akio Machida, Kanagawa (JP); Miyako Nakagoe, Kanagawa (JP); Setsuo Usui, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/871,033

(22) Filed: May 31, 2001

(65) Prior Publication Data

US 2002/0016027 A1 Feb. 7, 2002

(30) Foreign Application Priority Data

May 31, 2000 (JP) ...................... P2000-162114

(51) Int. Cl.[7] ......................... H01L 21/425; H01L 21/26
(52) U.S. Cl. ...................... 438/530; 438/535
(58) Field of Search ................. 438/164, 530, 438/535

(56) References Cited

U.S. PATENT DOCUMENTS

| | | | |
|---|---|---|---|
| 5,945,711 A | * | 8/1999 | Takemura et al. .......... 257/344 |
| 6,049,092 A | * | 4/2000 | Konuma et al. ............ 257/324 |
| 6,248,606 B1 | * | 6/2001 | Ino et al. .................... 438/150 |
| 6,259,120 B1 | * | 7/2001 | Zhang et al. ................. 257/66 |
| 6,376,290 B1 | * | 4/2002 | Gosain et al. .............. 438/166 |

FOREIGN PATENT DOCUMENTS

| | | | | |
|---|---|---|---|---|
| JP | 58066329 A | * | 4/1983 | ......... H01L/21/265 |
| JP | 07335890 A | * | 12/1995 | ......... H01L/29/786 |

* cited by examiner

*Primary Examiner*—Eddie Lee
*Assistant Examiner*—Paul E Brock, II
(74) *Attorney, Agent, or Firm*—Sonnenschein, Nath & Rosenthal LLP

(57) ABSTRACT

A polycrystalline silicon layer is formed on a substrate. An insulating layer and a gate electrode are formed on the polycrystalline silicon layer. Then, a channel region, a source region and a drain region are formed in a self-aligned manner by doping an impurity in the polycrystalline silicon layer using the gate electrode as a mask. Then, an energy absorption layer is formed so as to cover the entire substrate and a pulsed laser beam is irradiated from the energy absorption layer side. The energy of the pulsed laser beam is almost completely absorbed in the energy absorption layer and a heat treatment is indirectly performed on the underlying layers by radiating the heat. In other words, activation of the impurity and removal of defects in the insulating layer are performed at the same time without damaging the substrate by the heat.

7 Claims, 4 Drawing Sheets

METHOD OF MANUFACTURING SEMICONDUCTOR DEVICE

RELATED APPLICATION DATA

The present application claims priority to Japanese Application No. P2000-162114 filed May 31, 2000, which application is incorporated herein by reference to the extent permitted by law.

BACKGROUND OF THE INVENTION

The present invention relates to a method of manufacturing a semiconductor device including the step of activating an impurity doped to a semiconductor layer by an energy beam. Specifically, the present invention relates to a method of manufacturing a semiconductor device preferably used for manufacturing a top-gate thin film transistor (TFT) on a low-heat-resistant substrate.

In recent years, polycrystalline silicon (Si) TFTs formed on glass substrates are used for picture elements and drivers of liquid crystal displays as switching function devices, and also have been developed as semiconductor memories. In the semiconductor devices such as TFT and the like, it is necessary that the substrates are light, shock-resistant, and have a flexibility so that they are not damaged when stress is being applied to some extent. Therefore, glass substrates, silicon substrates or the like have been used as the substrates in the related art. The glass substrates have low heat resistance (heat-resistant temperature is 400° C.). Therefore, heat treatments on semiconductor layers and the like have been performed by maintaining the substrate temperature relatively low through performing local heating using energy beams such as lasers, infrared lamps and the like.

Recently, plastic substrates have come into use since the plastic substrates are lighter and more shock-resistant compared to the above-mentioned substrates. However, the plastic substrates made of polyethylene terephthalate (PET) or the like have the heat-resistant temperature of about 200° C. or below, which is lower than that of glass substrates.

Therefore, it is necessary to manufacture a semiconductor device using the plastic substrate by performing all the manufacturing steps at 200° C. or below. Specifically, not only a heat treatment performed for crystallization or activation of an impurity, but also a fabrication of thin films such as silicon dioxide ($SiO_2$) films used for gate insulating films, interlayer insulating films and the like is performed under the temperature condition at 200° C. or below, which is generally performed at a temperature higher than 200° C.

However, in general, it is impossible to activate the impurity doped into the semiconductor layer at 200° C. or below. Also, if $SiO_2$ films are formed at 200° C. or below, there are a large amount of defects in the obtained $SiO_2$ films and in the interface between the obtained $SiO_2$ films and the semiconductor layer. A method of removing the defects by applying a heat treatment after forming the $SiO_2$ films is not applicable to the plastic substrates since the method needs to be performed under the condition at least at 400° C. or more.

Also, even if the above-mentioned heat treatment is performed by locally heating the surface of the device by an energy beam, temperatures in the insulating layer and the layers thereunder raises suddenly since the energy beam instantly performs high-temperature heating. As a result, the plastic substrates, which have very low thermal resistance, are sometimes damaged by the heat of the irradiated beam.

SUMMARY OF THE INVENTION

The invention has been designed to overcome the foregoing problems. The object of the invention is to provide a method of manufacturing a semiconductor device, which can manufacture a semiconductor device having an excellent characteristic on a low-heat-resistant substrate.

A method of manufacturing a semiconductor device of the invention comprises the steps of: forming a semiconductor layer on a substrate; selectively forming a metal layer on the semiconductor layer with an insulating layer inbetween; selectively doping an impurity into the semiconductor layer using the metal layer as a mask; forming an energy absorption layer so as to cover the insulating layer and the metal layer; and activating the impurity doped into the semiconductor layer by irradiating an energy beam from the energy absorption layer side.

In the method of manufacturing a semiconductor device of the invention, the irradiated energy beam is once absorbed in an energy absorption layer, and through the energy absorption layer, indirectly heat a metal layer, an insulating layer and a semiconductor layer thereunder without damaging the low-heat-resistant substrate made of plastic or the like. Thereby, an impurity in the semiconductor layer is activated and defects in the insulating layers are removed.

Other and further objects, features and advantages of the invention will appear more fully from the following description.

DETAILED DESCRIPTION OF THE PREFERRED EMBODIMENTS

Figure 1:
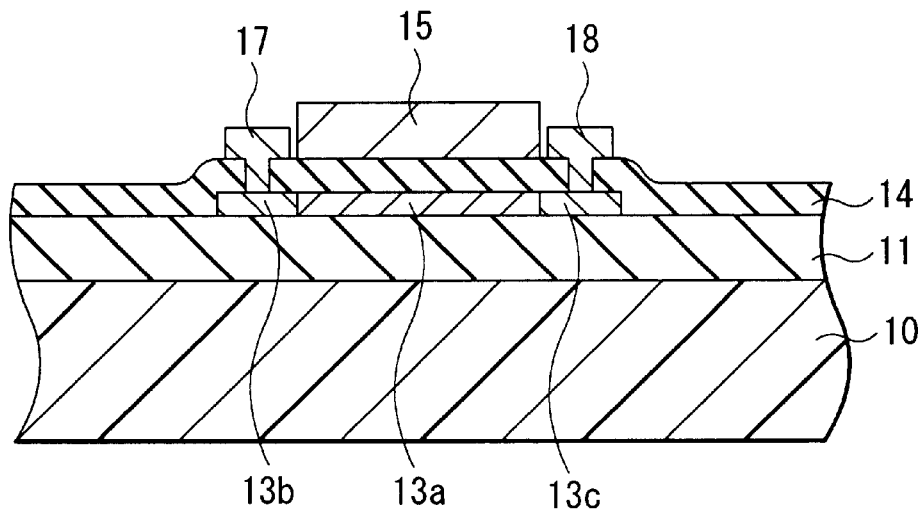
FIG. 1 is a cross section showing the structure of a TFT according to a first embodiment of the invention.

In the followings, embodiments of the invention will be described in detail by referring to the drawings.

[First Embodiment]

FIG. 1 shows a cross sectional structure of a top-gate TFT according to a first embodiment of the invention. In the TFT, for example, a polycrystalline silicon (Si) layer 13 comprising a channel region 13a, a source region 13b and a drain region 13c is provided on a substrate 10 with a buffer layer 11 inbetween. The source region 13b and the drain region 13c are formed being away from each other while being adjacent to the channel region 13a. A gate electrode 15 is formed on the channel region 13a with an insulating layer 14 inbetween. A source electrode 17 is electrically connected to the source region 13b, and a drain electrode 18 is electrically connected to the drain region 13c, respectively.

A method of manufacturing the TFT will be described hereinafter by referring to FIG. 1 to FIG. 5.

Figure 2:
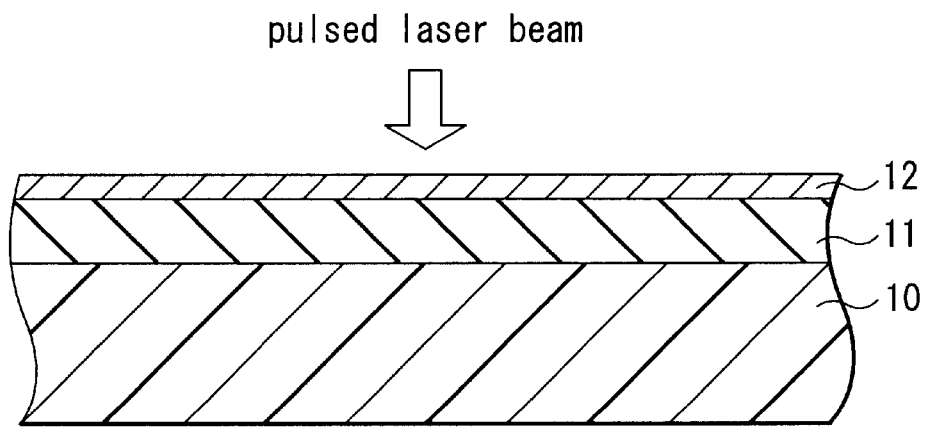
FIG. 2 is a cross section for describing a manufacturing step of the TFT shown in FIG. 1.

First, as shown in FIG. 2, the buffer layer 11 is formed on the substrate 10 at the heat-resistant temperature of the substrate 10 or below. The buffer layer 11 is for protecting the substrate 10 having, for example, the heat-resistant temperature of about 200° C. or below from the heat by an adiabatic effect.

For example, an organic material is used for the substrate 10. Specifically, polymeric materials are preferable. Examples of the polymeric materials are: polyester such as polyethylene sulfone (PES), polyethylene terephthalate (PET), polyethylene naphthalate and polycarbonate; polyolefin such as polypropylene; polyphenylene sulfide and the like; polyamide, aromatic polyamide; polyether ketone; and polyimide. The substrate 10 may be formed containing any one or more of these polymeric materials. The thickness of the substrate 10 is, for example, 200 μm. However, the thinner the substrate is the better in order to give flexibility to the TFT and to miniaturize. The softening point of the organic materials is at 250° C. or below. Specifically, the heat-resistant temperature of the PES is about 200° C. and that of the PET is about 100° C. Also, for example, silicon dioxide ($SiO_2$) is used for the buffer layer 11. Other materials that can be used are silicon oxide ($SiO_2$), silicon nitride ($SiN_x$), silicon oxide nitride ($SiO_xN_x$), and laminated films of these materials. The thickness of the buffer layer 11 is, for example, 300 nm.

Then, an amorphous silicon layer 12 is formed on the buffer layer 11 at the heat-resistant temperature of the substrate 10 or below. The thickness of the amorphous silicon layer 12 is, for example, 30 nm. Examples of methods for forming the buffer layer 11 and the amorphous silicon layer 12 are reactive sputtering, plasma enhanced CVD (Plasma Enhanced Chemical Vapor Deposition; PECVD), low-pressure CVD (LPCD), and physical vapor deposition. In this embodiment, the amorphous silicon layer 12 is formed of silicon (Si). However, one and more kinds of semiconductors selected from silicon, silicon germanium (SiGe), germanium (Ge), and silicon carbide (SiC) can be used.

Figure 3:
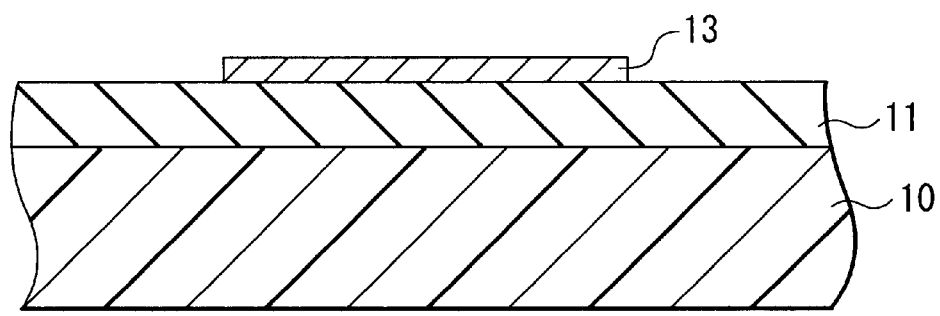
FIG. 3 is a cross section for describing a manufacturing step following the step shown in FIG. 2.

Then, the amorphous silicon layer 12 is heated by, for example, irradiating a pulsed laser beam. Thereby, the amorphous silicon layer 12 crystallizes and becomes the polycrystalline silicon layer 13 as shown in FIG. 3. As the pulsed laser beam, it is preferable to use a laser having the ultraviolet wavelength which is easily absorbed in the amorphous silicon layer 12. Specific examples are XeCl excimer laser (wavelength of 308 nm), KrF excimer laser (wavelength of 248 nm), ArF excimer laser (wavelength of 193 nm), XeF excimer laser (wavelength of 351 nm) and frequency-tripled (355 nm) or frequency-quadrupled (266 nm) Nd: YAG laser. The condition of the laser including the wavelength, the energy density, the pulse width and the number of irradiated pulses is selected appropriately in accordance with the thickness and the like of the amorphous silicon layer 12. However, it is preferable that the pulse width of the beam is within the range of 100 ps to 300 ns, both inclusive, in order to obtain the polycrystalline silicon layer 13 with an excellent crystallinity by sufficiently heating the amorphous silicon layer 12.

The irradiated pulsed laser beam is almost completely absorbed in the amorphous silicon layer 12. Therefore, the substrate 10 is hardly heated. The polycrystalline silicon layer 13 corresponds to a specific example of a "semiconductor layer" of the invention. It is not necessary that the entire portion of the "semiconductor layer" is polycrystal. For example, it may be formed to have a polycrystalline region which partially has a crystallinity.

Then, the polycrystalline silicon layer 13 is patterned to a predetermined shape such as an island shape by, for example, lithography and etching.

Figure 4:
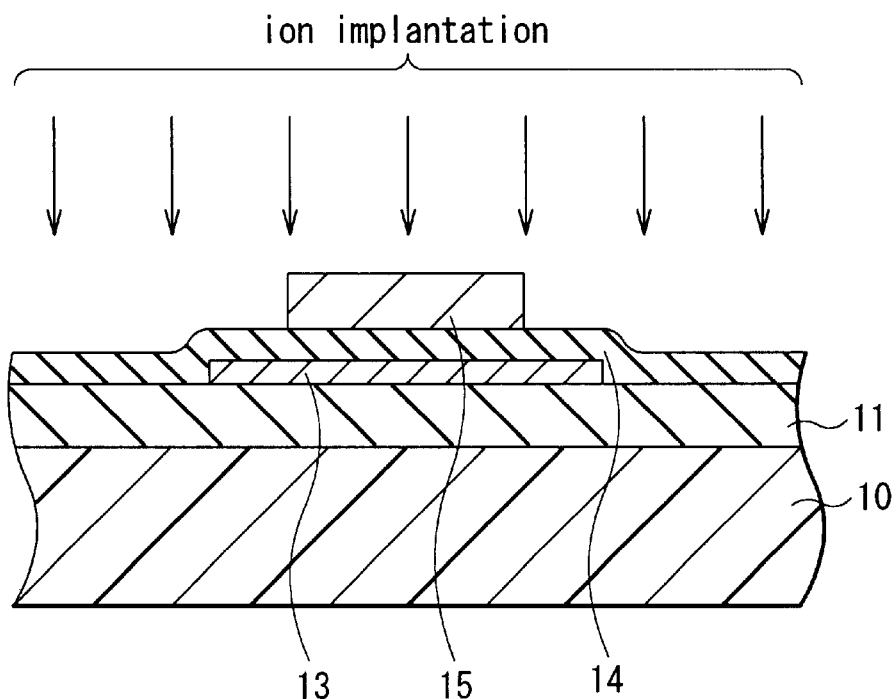
FIG. 4 is a cross section for describing a manufacturing step following the step shown in FIG. 3.

Next, as shown in FIG. 4, an insulating layer 14 made of, for example, $SiO_2$ or $SiN_x$ is formed to cover the patterned polycrystalline silicon layer 13 at the heat-resistant temperature of the substrate 10 or below. The insulating layer 14 is formed by, for example, reactive sputtering, PECVD, physical vapor deposition, or JVD (Jet Vapor Deposition). Also, it can be formed by plasma oxidation or plasma nitriding of the surface of the polycrystalline silicon layer 13. The thickness of the insulating layer 14 is, for example, 50 nm.

Then, a gate electrode 15 made of, for example, aluminum (Al) is formed on the insulating layer 14 by sputtering or deposition. Other examples can be used for the gate electrode 15 are copper (Cu), molybdenum (Mo), tantalum (Ta), platinum (Pt), and ITO (indium-tin oxide). The thickness of the gate electrode 15 is, for example, 240 nm. The gate electrode 15 corresponds to a specific example of a "metallic layer" of the invention.

Then, an impurity is doped into the polycrystalline silicon layer 13 by, for example, ion implantation using the gate electrode 15 as a mask at the heat-resistant temperature of the substrate 10 or below. For example, phosphorus (P) is used as an n-type impurity in case of n-channel-type TFT and, boron (B) is used as a p-type impurity in case of p-channel-type TFT. Thereby, the source region 13b and the drain region 13c as the impurity-doped region, and the channel region 13a sandwiched therebetween as the non-doped region are formed in a self-aligned manner against the gate electrode 15 (see FIG. 5).

Figure 5:
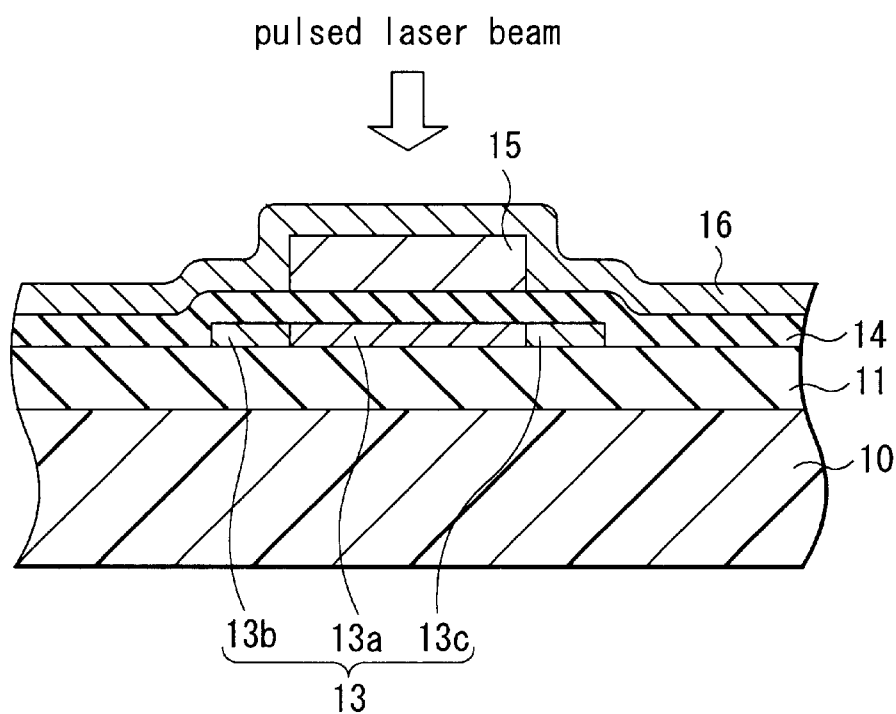
FIG. 5 is a cross section for describing a manufacturing step following the step shown in FIG. 4.

As shown in FIG. 5, an energy absorption layer 16 is formed to cover the surface of the gate electrode 15 and the insulating layer 14 at the heat-resistant temperature of the substrate 10 or below. The energy absorption layer 16 is formed of materials with the band gap being equal to and lower than the energy of the energy beam so that the energy irradiated by the energy beam is well absorbed as will be described later. Specific examples of the material are carbon (C), silicon (Si), germanium (Ge), silicon carbide (SiC), silicon nitride (SiN), aluminium nitride (AlN), silicon germanium (SiGe), and transition metals such as molybdenum (Mo), tantalum (Ta), tungsten (W), nickel (Ni), and chrome (Cr). One of or plurality of these materials may be used. In the case where the energy absorption layer 16 is removed after irradiating the energy beam, the materials having etching selectivity to the gate electrode 15 should be used as the energy absorption layer 16. For example, if the gate electrode 15 is made of aluminum (Al), it is preferable to use amorphous silicon as the material of the energy absorption layer 16. The thickness of the energy absorption layer 16 is, for example, 30 nm.

Then, the energy absorption layer 16 is heated irradiating an ultraviolet pulsed laser beam by, for example, excimer laser from the energy absorption layer 16 side. At this time, the same pulsed laser beam used for irradiating the amorphous silicon layer 12 can be used. The irradiated pulsed laser beam is almost completely absorbed in the energy absorption layer 16, and a heat treatment is indirectly performed by the heat radiated from the energy absorption layer 16. The energy once absorbed in the energy absorption layer 16 is uniformly radiated from the entire surface of the energy absorption layer 16 and then propagate to the gate electrode 15, the insulating layer 14 and further to the polycrystalline silicon layer 13. The gate electrode 15 has an excellent thermal conductivity, thereby heating the neighboring region, specifically the insulating layer 14, which directly lies under the gate electrode 15. As described, the insulating layer 14 and the layers thereunder are uniformly and slowly heated, and the substrate 10 is hardly heated.

By the heat treatment, the impurity in the polycrystalline silicon layer 13 is activated. At the same time, the gate electrode 15 is heated thereby heating the insulating layer 14 and the interface between the insulating layer 14 and the polycrystalline silicon layer 13. As a result, defects inside the insulating layer 14 and in the interface between the insulating layer 14 and the polycrystalline silicon layer 13 are removed. It is desired that the impurity in the polycrystalline silicon layer 13 be activated 20% or more. In the case where a laser beam is directly irradiated to the insulating layer 14 as in the related art, it is necessary to reduce the amount of irradiation in order to suppress an increase in the temperature of the substrate 10. Therefore, the insulating layer 14 and the layers thereunder cannot be sufficiently heated and the temperature thereof is distributed in the layer direction since the beam energy is locally radiated. In this case also, for example, parts of the polycrystalline silicon layer 13 and the insulating layer 14 may not be sufficiently heated.

Next, as shown in FIG. 1, the energy absorption layer 16 is removed. Then, the source electrode 17 and the drain electrode 18 are formed on the source region 13b and the drain region 13c, respectively. The source electrode 17 and the drain electrode 18 made of, for example, aluminum can be formed by publicly-known methods such that a film is formed by sputtering or physical vapor deposition and then patterned by lithography and etching. Also, a protection film may be formed by covering the surface of the TFT formed as described by, for example, oxide such as $SiO_2$, $SiN_x$, or the like.

As described, according to the embodiment, the pulsed laser beam is irradiated after providing the energy absorption layer 16 on the substrate 10. Therefore, like the energy of the laser beam, which is radiated instantly and locally, is once absorbed in the energy absorption layer 16 and then indirectly radiated from the entire surface of the energy absorption layer 16. As a result, the substrate 10 is hardly heated while the gate electrode 15, the insulating layer 14 and the polycrystalline silicon layer 13 underlying the energy absorption layer 16 are uniformly and slowly heated. Therefore, damages on the substrate 10 caused by the direct irradiation of the laser beam can be prevented. At the same time, the impurity in the polycrystalline silicon layer 13 is activated and defects inside and in the neighboring region of the insulating layer 14 can be sufficiently removed.

Also, according to the embodiment, the impurity is ion-implanted to the polycrystalline silicon layer 13 using the gate electrode 15 as a mask. Therefore, the channel region 13a, the source region 13b and the drain region 13c can be formed in one step in a self-aligned manner without separately forming a mask.

[Second Embodiment]

Figure 6:
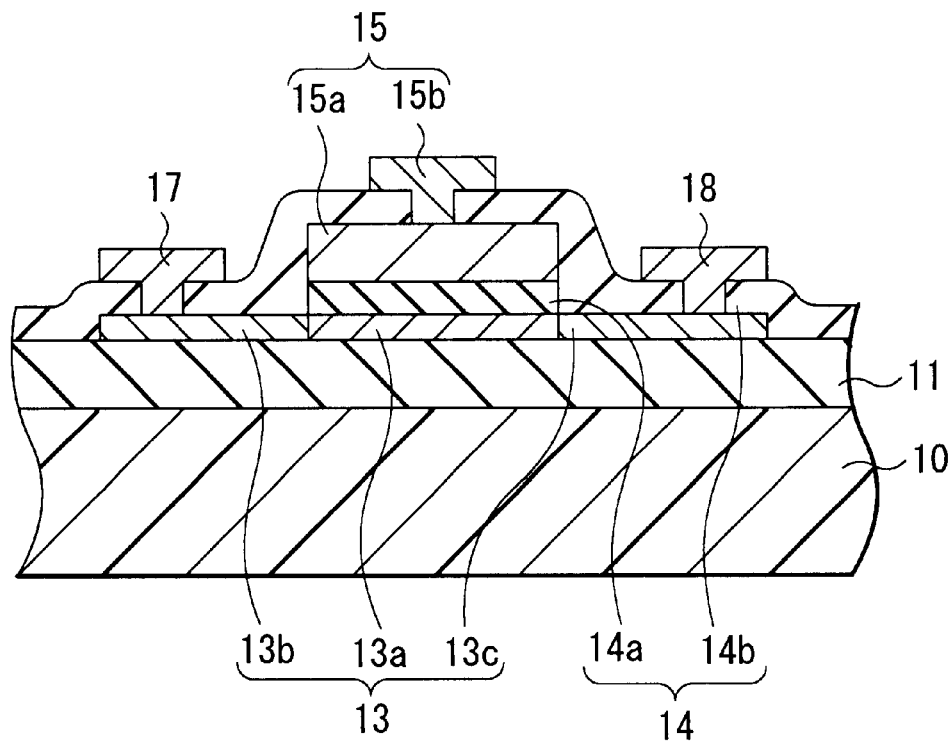
FIG. 6 is a cross section showing the structure of a TFT according to a second embodiment of the invention.

FIG. 6 shows the cross sectional structure of a top-gate TFT according to a second embodiment of the invention. The TFT has the same structure as that of the first embodiment except that a gate electrode 15a is formed between insulating layers 14a and 14b. The insulating layers 14a and 14b, and the gate electrodes 15a and 15b correspond to the insulating layer 14 and the electrode gate 15 of the first embodiment. Therefore, the same structural elements as those of the first embodiment are indicated by the same reference numerals, and the description will be omitted.

A method of manufacturing the TFT will be described hereinafter by referring to FIG. 6 to FIG. 9.

First, in the same manner as in the first embodiment, the buffer layer 11 and the amorphous silicon layer 12 are formed on the substrate 10 in this order at the heat-resistant temperature of the substrate 10 or below, and then the amorphous silicon layer 12 is heated by a pulsed laser beam. Thereby, the amorphous silicon layer 12 crystallizes and becomes the polycrystalline silicon layer 13. As the pulsed laser beam, the same laser beam as in the first embodiment such as excimer laser can be used. The irradiated pulsed laser beam is almost completely absorbed in the amorphous silicon layer 12 and the substrate 10 is hardly heated.

Figure 7:
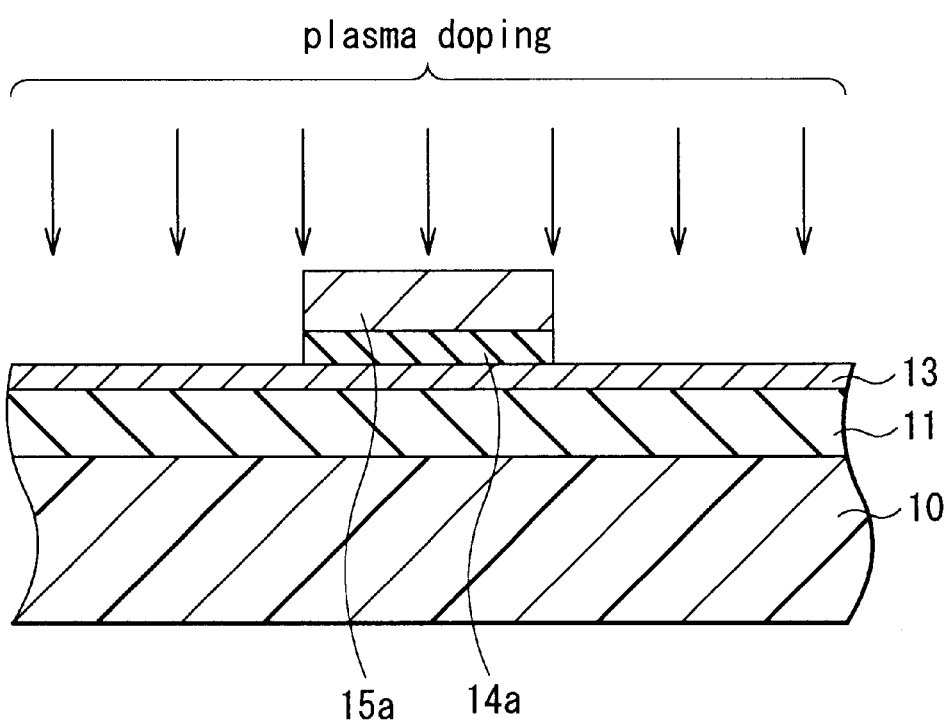
FIG. 7 is a cross section for describing a manufacturing step of the TFT shown in FIG. 6.

Then, as shown in FIG. 7, the insulating layer 14a is formed on the polycrystalline silicon layer 13 at the heat-resistant temperature of the substrate 10 or below, and the gate electrode 15a is formed thereon. Then, a selective etching is performed by ECR-RIE (Electron Cyclotron Resonance Reactive Ion Etching) using the gate electrode 15a as a mask in a mixed gas of $CF_4$ and $H_2$. Thereby, the insulating layer 14a on the polycrystalline silicon layer 13, which is to be the source region 13b and the drain region 13c, is removed in a self-aligned manner.

Then, an impurity is doped into the polycrystalline silicon layer 13 by plasma doping using the gate electrode 15a as a mask. The plasma-doping is performed by exposing the substrate 10 with a temperature of, for example, 110° C. to glow-discharge plasma of a mixed gas of $PH_3$ and He to adsorb phosphorous (P) onto the surface of the polycrystalline silicon layer 13. As the impurity, for example, a p-type impurity such as boron (B) can be used besides the n-type impurity such as phosphorous (P). In such a case, the substrate 10 is exposed to $B_2H_6$ plasma to adsorb boron (B). The adsorbed impurity diffuses only in the region near (1 nm from the surface) the surface of the polycrystalline silicon layer 13 so that it is sufficiently diffused by irradiating a laser described in the following. Thereby, the impurity is doped inside the polycrystalline silicon layer 13.

Figure 8:
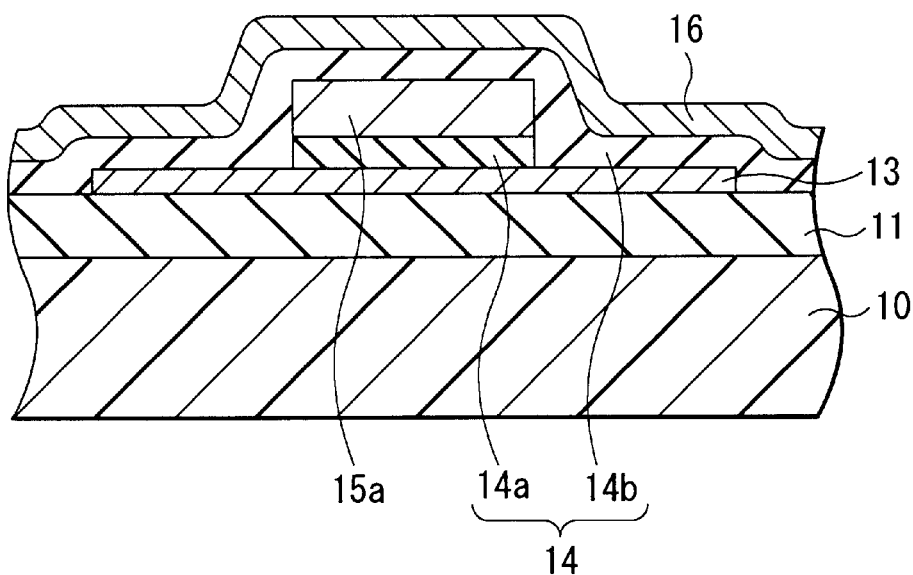
FIG. 8 is a cross section for describing a manufacturing step following the step shown in FIG. 7.

Next, as shown in FIG. 8, the insulating layer 14b and the energy absorption layer 16 are formed in this order on the polycrystalline silicon layer 13 and the gate electrode 15 at the heat-resistant temperature of the substrate 10 or below.

Figure 9:
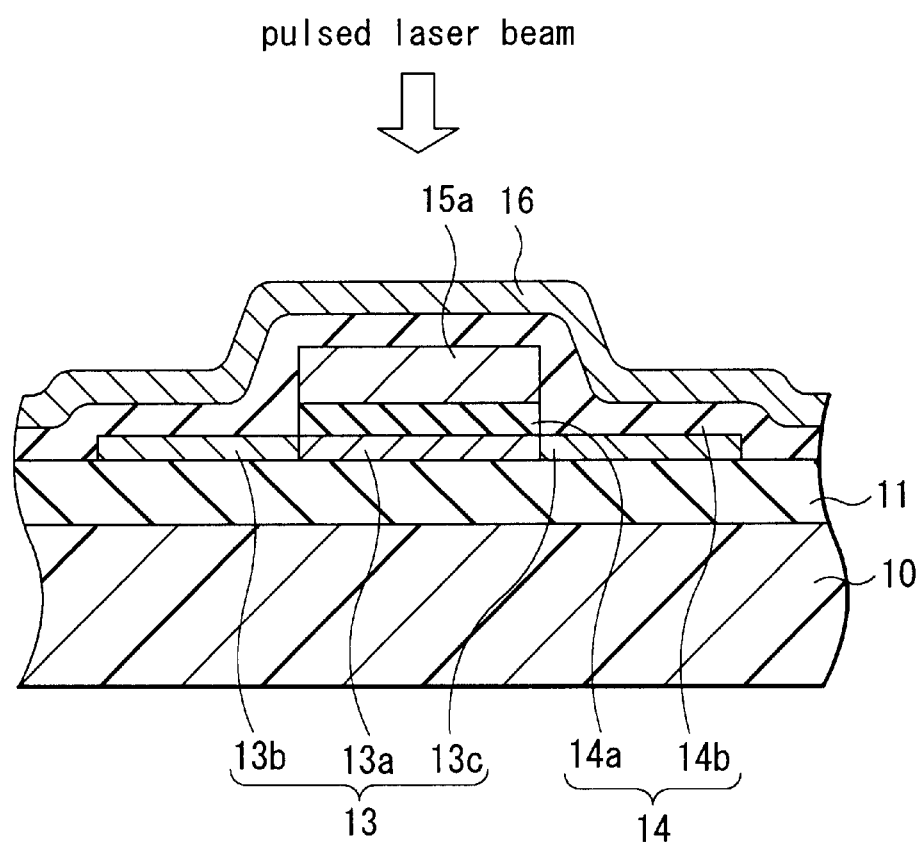
FIG. 9 is a cross section for describing a manufacturing step following the step shown in FIG. 8.

Next, as shown in FIG. 9, the energy absorption layer 16 is heated irradiating an ultraviolet pulsed laser beam by, for example, excimer laser from the energy absorption layer 16 side. The laser beam is almost completely absorbed in the energy absorption layer 16 and then the heat is radiated. By the heat, the impurity (at this time phosphorous) in the polycrystalline silicon layer 13 is diffused and activated. At the same time, the insulating layers 14a and 14b, and the interfaces between the insulating layers 14a, 14b and the polycrystalline silicon layer 13 are heated through the heated gate electrode 15a. As described, the heat treatment is indirectly performed through the energy absorption layer 16 so that the substrate 10 is hardly heated. It is desired that the impurity in the polycrystalline silicon layer 13 be activated 20% or more. Thereby, the source region 13b and the drain region 13c as the impurity-doped region, and the channel region 13a therebetween as the non-doped region are formed in a self-aligned manner against the gate electrode 15a. At the same time, defects inside the insulating layers 14a and 14b and in the interfaces between the insulating layers 14a, 14b and the polycrystalline silicon layer 13 are removed.

Next, as shown in FIG. 6, the energy absorption layer 16 is removed. Then, the gate electrode 15b, the source electrode 17 and the drain electrode 18 are formed on the channel region 13a (precisely, the gate electrode 15a), the source region 13b and the drain region 13c, respectively.

As described, in the embodiment, a pulsed laser beam is also radiated after providing the energy absorption layer 16 on the substrate 10. Therefore, as in the first embodiment, the energy of the laser beam radiated locally is once absorbed in the energy absorption layer 16 and then indirectly radiated from the entire surface of the energy absorption layer 16. As a result, the substrate 10 is hardly heated while the layers underlying the energy absorption layer 16 are uniformly and slowly heated. Therefore, damages on the substrate 10 caused by the direct irradiation of the laser beam can be prevented. At the same time, the impurity in the polycrystalline silicon layer 13 is activated and defects inside and in the neighboring region of the insulating layer 14 can be sufficiently removed.

Also, in the embodiment, the impurity is plasma-doped to the polycrystalline silicon layer 13 using the gate electrode 15 as a mask as in the first embodiment. Therefore, the channel region 13a, the source region 13b and the drain region 13c can be formed in one step in a self-aligned manner without separately forming a mask.

The invention has been described by referring to the embodiments. However, the invention is not limited to the above-mentioned embodiments but various kinds of modifications are possible. For example, in the above-mentioned embodiments, a method of manufacturing a semiconductor device is described by specifically referring to a TFT. However, the invention can be widely applied to semiconductor devices having other structures, which can be fabricated by the following method: a metal layer is formed on a semiconductor layer which is formed on a substrate with an insulating layer inbetween; an impurity is doped into the semiconductor layer using the metal layer as a mask; an energy absorption layer is formed all over the surface of the layer structure; and then activate the impurity by irradiating an energy beam from the top.

As described, in the method of manufacturing a semiconductor device of the invention, the energy absorption layer is formed so as to cover the insulating layer and the metal layer provided on the semiconductor layer, and an energy beam is irradiated from the energy absorption layer side. Therefore, the metal layer, the insulating layer and the semiconductor layer underlying the energy absorption layer are heated by the irradiated energy through the energy absorption layer but the substrate is hardly heated. As a result, damages on the substrate caused by the direct irradiation of the laser beam can be prevented. Also, with the method, the insulating layer and the semiconductor layer are sufficiently heated. Therefore, the impurity inside the semiconductor layer is activated and defects in the insulating layer and the neighboring region can be effectively removed at the same time. Thereby, a semiconductor device with an excellent characteristic can be obtained. Consequently, a low-heat-resistant substrate made of, for example an organic substance can be used as the substrate so that a semiconductor device which is light, shock-resistant, and has an excellent characteristic can be manufactured.

Obviously many modifications and variations of the present invention are possible in the light of above teachings. It is therefore to be understood that within the scope of the appended claims the invention may be practiced otherwise than as specifically described.

What is claimed is:

1. A method of manufacturing a semiconductor device, the method comprising the steps of:
   forming a semiconductor layer on a substrate;
   forming a gate insulating layer on the semiconductor layer, the gate insulating layer;
   covering an entire top surface of the semiconductor layer opposite the substrate and side surfaces of the semiconductor layer;
   selectively forming a metal layer on the semiconductor layer with the gate insulating layer in between;
   selectively doping an impurity into the semiconductor layer using the metal layer as a mask;
   forming an energy absorption layer so as to cover the metal layer and the gate insulating layer that covers the entire top surface of the semiconductor layer opposite the substrate and the side surfaces of the semiconductor layer, the energy absorption layer not directly contacting the semiconductor layer; and
   activating the impurity doped into the semiconductor layer by irradiating an energy beam from the energy absorption layer side,
   wherein the energy absorption layer is formed of one or more kinds of materials selected from molybdenum (Mo), tantalum (Ta), tungsten (W), nickel (Ni), and chrome (Cr).

2. A method of manufacturing a semiconductor device as claimed in claim 1, wherein the substrate has a softening point of 250° C. or below.

3. A method of manufacturing a semiconductor device as claimed in claim 2, wherein the substrate is formed of an organic polymeric material.

4. A method of manufacturing a semiconductor device as claimed in claim 1, wherein the semiconductor layer is formed of one and more kinds of semiconductors selected from silicon (Si), silicon germanium (SiGe), germanium (Ge), and silicon carbide (SiC).

5. A method of manufacturing a semiconductor device as claimed in claim 1, wherein the activation ratio of the impurity in an impurity region of the semiconductor layer is 20% or more.

6. A method of manufacturing a semiconductor device as claimed in claim 1, wherein the energy beam is a pulsed laser beam.

7. A method of manufacturing a semiconductor device as claimed in claim 6, wherein a pulse width of the pulsed laser beam is within the range of 100 ps to 300 ns, both inclusive.

* * * * *